United States Patent
Lim et al.

(10) Patent No.: US 8,810,014 B2
(45) Date of Patent: Aug. 19, 2014

(54) SEMICONDUCTOR PACKAGE INCLUDING CONDUCTIVE MEMBER DISPOSED BETWEEN THE HEAT DISSIPATION MEMBER AND THE LEAD FRAME

(71) Applicant: Samsung Electro-Mechanics Co., Ltd., Gyunggi-do (KR)

(72) Inventors: Jae Hyun Lim, Gyunggi-do (KR); Chang Seob Hong, Gyunggi-do (KR); Young Hoon Kwak, Gyunggi-do (KR); Young Ho Sohn, Gyunggi-do (KR)

(73) Assignee: Samsung Electro-Mechanics, Co., Ltd., Suwon, Gyunggi-Do (KR)

( * ) Notice: Subject to any disclaimer, the term of this patent is extended or adjusted under 35 U.S.C. 154(b) by 0 days.

(21) Appl. No.: 13/761,750

(22) Filed: Feb. 7, 2013

(65) Prior Publication Data
US 2014/0117522 A1   May 1, 2014

(30) Foreign Application Priority Data
Oct. 30, 2012   (KR) .................. 10-2012-0121315

(51) Int. Cl.
*H01L 23/495*   (2006.01)
(52) U.S. Cl.
USPC .................. 257/675; 257/666; 257/676
(58) Field of Classification Search
USPC .............................. 257/666, 675, 676
See application file for complete search history.

(56) References Cited

U.S. PATENT DOCUMENTS

| | | | |
|---|---|---|---|
| 2007/0096293 | A1 | 5/2007 | Wen et al. |
| 2009/0026594 | A1* | 1/2009 | Yee et al. .................. 257/676 |
| 2009/0230519 | A1* | 9/2009 | Otremba et al. .......... 257/666 |
| 2010/0148328 | A1* | 6/2010 | Son et al. ................. 257/675 |
| 2013/0127031 | A1* | 5/2013 | Hosseini et al. ......... 257/676 |

FOREIGN PATENT DOCUMENTS

| | | |
|---|---|---|
| JP | 05-226393 A | 9/1993 |
| JP | 08-017870 A | 1/1996 |
| JP | 2004-172211 A | 6/2004 |
| KR | 1998-083302 A | 12/1998 |
| KR | 1999-0081575 | 11/1999 |
| KR | 100698570 B1 | 3/2007 |

OTHER PUBLICATIONS

Korean Office Action issued in Application No. 10-2012-0121315 dated Dec. 6, 2013.

* cited by examiner

*Primary Examiner* — Thanh V Pham
(74) *Attorney, Agent, or Firm* — McDermott Will & Emery LLP

(57) ABSTRACT

There is provided a semiconductor package including: a lead frame having an electronic component mounted on one surface thereof; a heat dissipation substrate disposed downwardly of the lead frame; an insulating member disposed upwardly of the electronic component such that the electronic components are electrically connected to one another; a conductive member disposed between the insulating member and the lead frame and electrically connecting the electronic component to the lead frame; and a molded portion hermetically sealing the insulating member and the heat dissipation substrate.

11 Claims, 4 Drawing Sheets

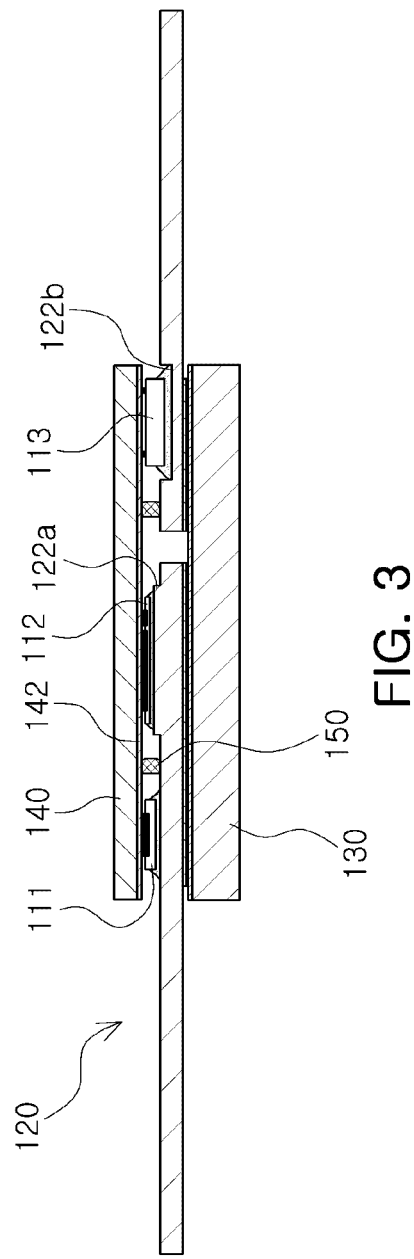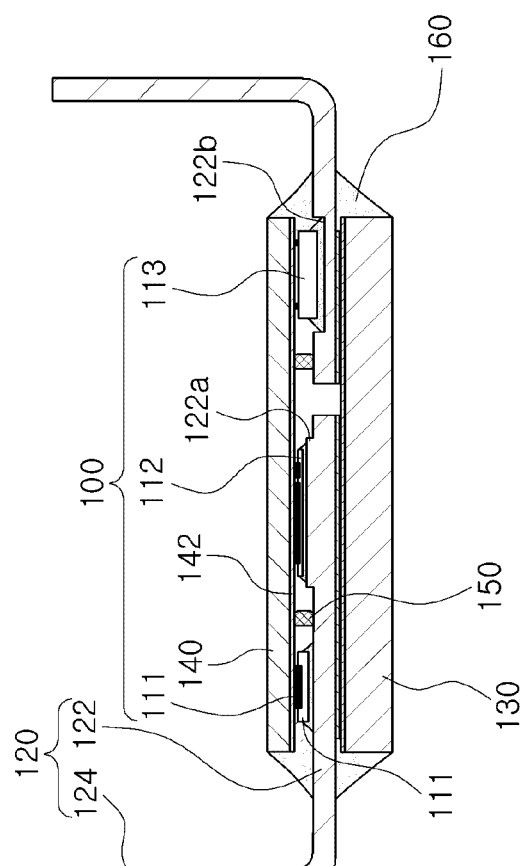
FIG. 3
FIG. 4

SEMICONDUCTOR PACKAGE INCLUDING CONDUCTIVE MEMBER DISPOSED BETWEEN THE HEAT DISSIPATION MEMBER AND THE LEAD FRAME

CROSS-REFERENCE TO RELATED APPLICATIONS

This application claims the priority of Korean Patent Application No. 10-2012-0121315 filed on Oct. 30, 2012, in the Korean Intellectual Property Office, the disclosure of which is incorporated herein by reference.

BACKGROUND OF THE INVENTION

1. Field of the Invention

The present invention relates to a semiconductor package, and more particularly, to a semiconductor package in which the reliability of electrical connections between electronic components as well as the reliability of electrical connections between an electronic component and a lead frame is enhanced.

2. Description of the Related Art

A semiconductor package includes a lead frame, a power semiconductor element mounted on a lead frame and a mold part molding the exterior of respective elements with resin or the like.

In general, a power semiconductor element mounted on a lead frame is electrically connected to a lead frame by a wire, and respective elements are also electrically connected to one another by wires.

However, when the number of mounted power semiconductor elements is increased, the number of wires for electrically connecting the respective elements is also increased, such that the processing of wiring may be complicated, while heat is also generated due to soldering during a wire bonding process which may cause wire deformation due to the heat and wires may be disconnected due to external impacts, or the like.

Also, when elements are connected by wires, since wires have a curved shape, elements may not be connected to one another by a significantly reduced distance therebetween, increasing inductance.

The Related Art Document mentioned below discloses a plastic package electrically connecting a semiconductor chip and a lead frame through wire bonding.

RELATED ART DOCUMENT

Korean Patent Laid-Open Publication No. 1999-0081575

SUMMARY OF THE INVENTION

An aspect of the present invention provides a semiconductor package in which electronic components are electrically connected to one another by a significantly reduced distance therebetween, the snapping of wires or the thermal deformation thereof due to a soldering process are prevented, and a fabrication process is simplified, allowing for a reduction in a semiconductor package size.

According to an aspect of the present invention, there is provided a semiconductor package including: a lead frame having an electronic component mounted on one surface thereof; a heat dissipation substrate disposed downwardly of the lead frame; an insulating member disposed upwardly of the electronic component such that the electronic components are electrically connected to one another; a conductive member disposed between the insulating member and the lead frame and electrically connecting the electronic component to the lead frame; and a molded portion hermetically sealing the insulating member and the heat dissipation substrate.

The lead frame may have a protrusion formed on one surface thereof, and the electronic component may be disposed in the protrusion.

The lead frame may have a recess formed in one surface thereof, and the electronic component may be disposed in the recess.

A plurality of the electronic components may be disposed on one surface of the lead frame, and upper surfaces of the electronic components may be positioned linearly.

The insulating member and the electronic components may be joined by using a conductive material.

The semiconductor package may further include a first heat sink attached to a lower side of the heat dissipation substrate.

The semiconductor package may further include a second heat sink attached to an upper side of the insulating member.

The molded portion may be formed of any one selected from among silicon gel, epoxy molding compound (EMC), and polyimide.

According to another aspect of the present invention, there is provided a semiconductor package including: a lead frame having a plurality of electronic components mounted on one surface thereof; a heat dissipation substrate disposed downwardly of the lead frame; a heat dissipation member electrically joined to the plurality of electronic components and having a conductive layer formed on one surface thereof; a conductive member disposed between the heat dissipation member and the lead frame and electrically connecting the electronic component and the lead frame; and a molded portion hermetically sealing the heat dissipation member and the heat dissipation substrate, wherein upper surfaces of the plurality of electronic components are positioned linearly.

The lead frame may include a protrusion and a recess provided on one surface thereof.

BRIEF DESCRIPTION OF THE DRAWINGS

The above and other aspects, features and other advantages of the present invention will be more clearly understood from the following detailed description taken in conjunction with the accompanying drawings, in which:

FIG. 3 is a cross-sectional view illustrating the semiconductor package in which an insulating member is disposed upwardly of the electronic components according to the embodiment of the present invention;

FIG. 4 is a schematic cross-sectional view of the semiconductor package according to the embodiment of the present invention;

DETAILED DESCRIPTION OF THE EMBODIMENTS

Figure 1:
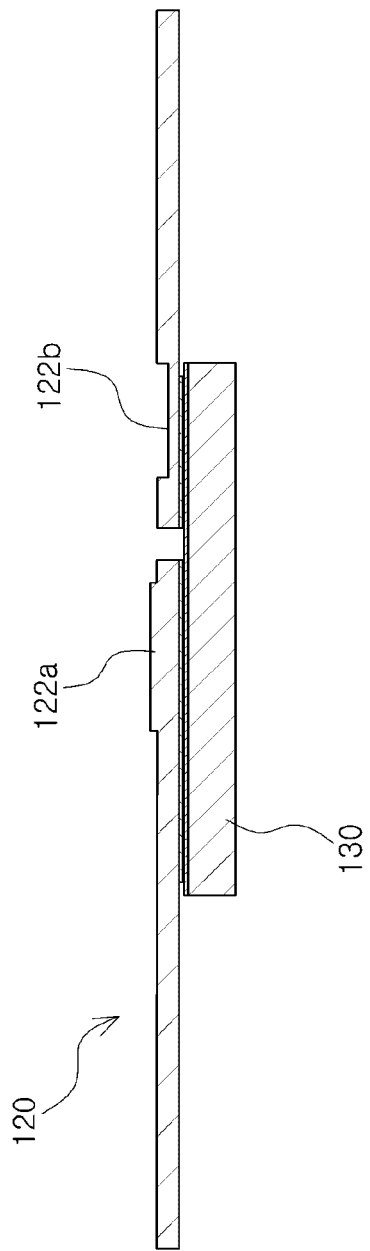
FIG. 1 is a cross-sectional view illustrating a semiconductor package in which a protrusion and a recess are formed on and in a lead frame according to an embodiment of the present invention.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

To begin with, terms with respect to directions will be defined. An outer radial direction or an inner radial direction may be a direction from the center of a molded portion 160 toward an outer edge of the molded portion 160 or vice versa, and the terms upwardly and downwardly may be directions from a heat dissipation substrate 130 toward an insulating member 140 or vice versa.

Figure 2:
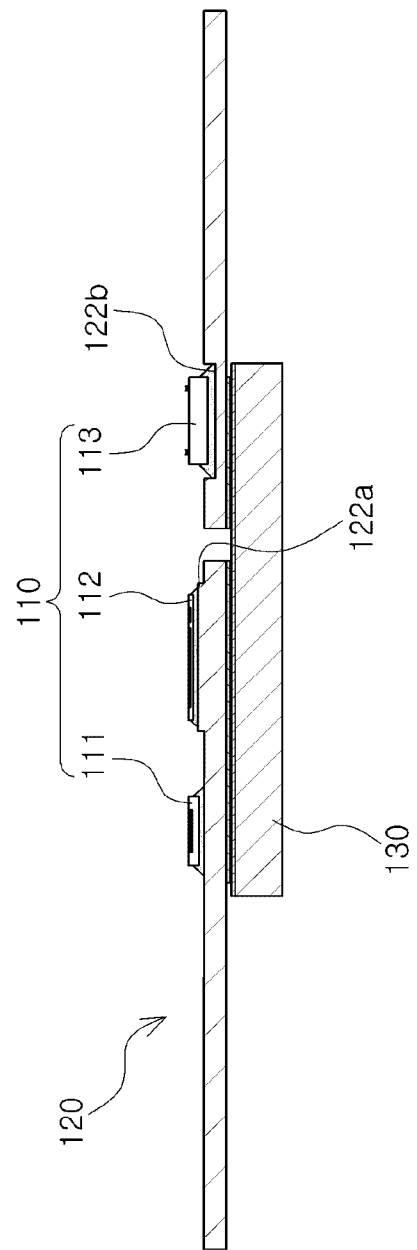
FIG. 2 is a cross-sectional view illustrating the semiconductor package in which electronic components are mounted on the lead frame according to the embodiment of the present invention.

FIG. 1 is a cross-sectional view illustrating a semiconductor package in which a protrusion and a recess are formed on and in a lead frame according to an embodiment of the present invention, and FIG. 2 is a cross-sectional view illustrating the semiconductor package in which electronic components are mounted on the lead frame according to the embodiment of the present invention.

Also, FIG. 3 is a cross-sectional view illustrating the semiconductor package in which an insulating member is disposed upwardly of the electronic components according to the embodiment of the present invention, and FIG. 4 is a schematic cross-sectional view of the semiconductor package according to the embodiment of the present invention.

Figure 5:
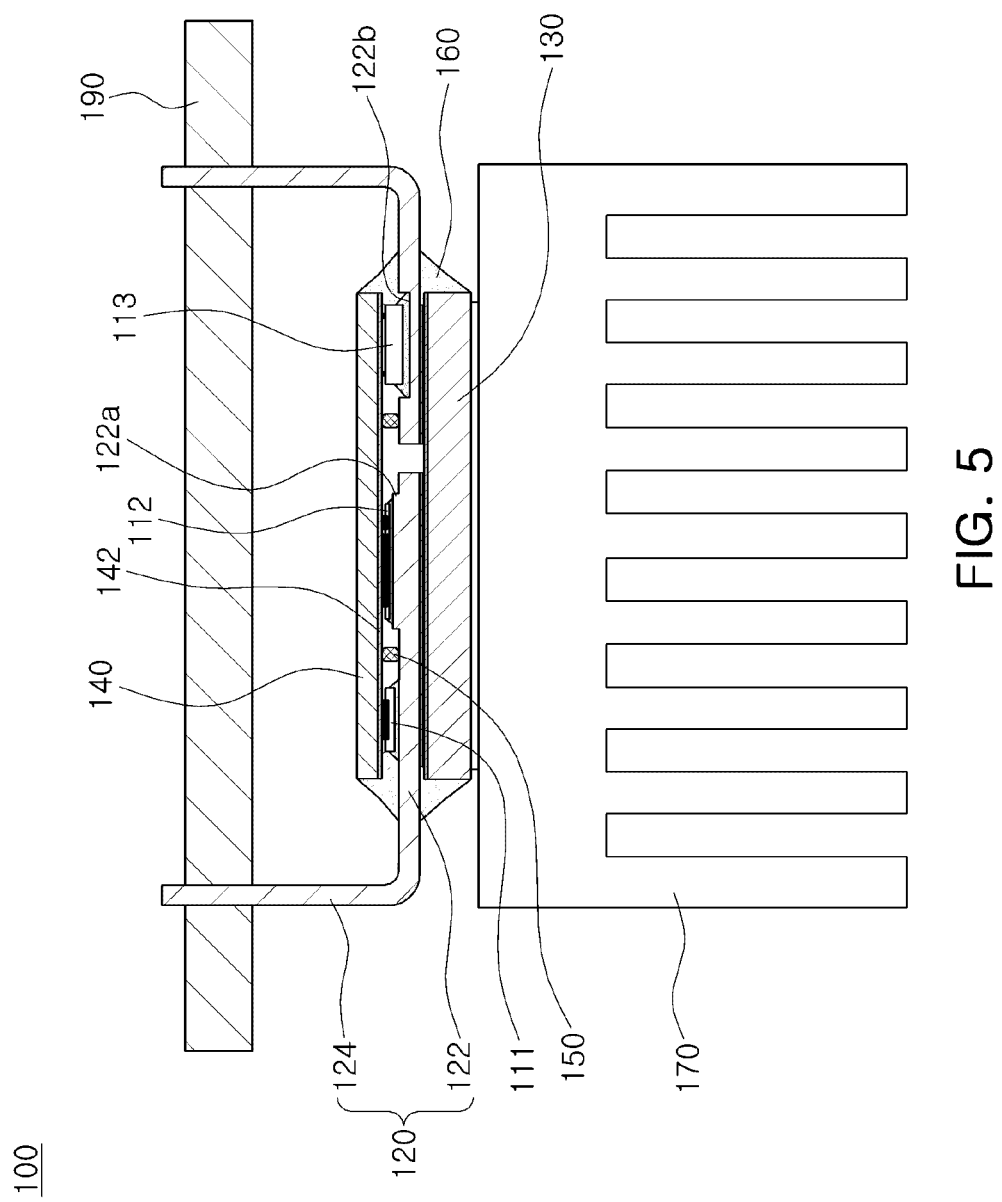
FIG. 5 is a cross-sectional view illustrating the semiconductor package connected to an external substrate according to the embodiment of the present invention.

Also, FIG. 5 is a cross-sectional view illustrating the semiconductor package connected to an external substrate according to the embodiment of the present invention.

Referring to FIGS. 1 through 5, a semiconductor package 100 according to an embodiment of the present invention may include an electronic component 110, a lead frame 120, a heat dissipation substrate 130, an insulating member 140, a conductive member 150, and a molded portion 160.

The electronic component 110 may include various electronic elements such as a passive element or an active element. Any electronic elements may be used as the electronic components 110 as long as they are mounted on or installed within the lead frame 120.

Namely, the electronic component 110 according to the embodiment of the present invention may include at least one active element such as a semiconductor chip and various passive elements.

Meanwhile, as illustrated in FIG. 4, in the semiconductor package 100 according to an embodiment of the present invention, the electronic component 110 and the lead frame 120 are electrically connected to one another by using the insulating member 140, that is, through a conductive layer 142 formed on one surface of the insulating member 140, rather than through a bonding wire.

This will be described in detail later.

The lead frame 120 includes a plurality of leads, and in this case, the respective leads may include an outer lead 124 connected to an external substrate 190 and an inner lead 122 connected to the electronic component 110.

Namely, the outer lead 124 may refer to a portion exposed to the outside of the molded portion 160, and the inner lead 122 may refer to a portion disposed within the molded portion 160.

Here, the outer lead 124 is protruded to an outer side of the molded portion 160 in a radial direction, and may be bent at one end thereof so as extend upwardly.

The electronic component 110 may be mounted on one surface of the inner lead 122, and the electronic component 110 may be electrically connected to the lead frame 120 by using the insulating member 140, that is, through a conductive member disposed between the insulating member and the lead frame.

Amounting electrode allowing the electronic component 110 to be mounted thereon or a circuit pattern (not shown) electrically connecting mounting electrodes may be formed on an upper surface of the lead frame 120.

Also, a protrusion 122a and a recess 122b may be provided on an upper surface of the lead frame 120.

The protrusion 122a may be formed by allowing at least a portion of the upper surface of the lead frame 120 to be upwardly protruded, and an upper surface of the protrusion 122a may have a flat surface.

The recess 122b may be formed by allowing at least a portion of the upper surface of the lead frame 120 to be recessed, and in this case, and the recess 122b may be formed through a mechanical process, a chemical etching process or a chemical deposition.

However, the present invention is not limited thereto and any concave shape may be formed in an upper surface of the lead frame 120.

Here, the electronic component 110 may be mounted on the protrusion 122a or the recess 122b, and any one of the protrusion 122a and the recess 122b may be formed according to a size and a shape of the mounted electronic component 110.

The electronic component 110 may be mounted on the upper surface of the lead frame 120. In detail, the electronic component 110 may be mounted on the protrusion 122a and the recess 122b of the upper surface of the lead frame 120, but the present invention is not necessarily limited thereto and thus the electronic component 110 may be mounted on an upper surface of the lead frame 120 on which the protrusion 122a and the recess 122b are not formed.

The electronic component 110 may have various sizes and shapes according to the type thereof. Thus, a relatively large electronic component 113 may be disposed in the recess 122b, a relatively small electronic component 112 may be disposed on the protrusion 122a, and a medium-size electronic component 111 may be disposed on an upper surface of the lead frame 120 on which the protrusion 122a and the recess 122b are not formed.

Thus, the electronic components 110 may be mounted such that upper surfaces thereof are positioned to have the same distance from an upper surface of the lead frame 120.

Namely, a plurality of electronic components 110 may be mounted on the upper surface of the lead frame 120, and in this case, the electronic components may be appropriately disposed on the inner lead 122 according to sizes thereof, whereby the upper surfaces of the electronic components 110 may be positioned to have the same distance from the upper surface of the lead frame 120.

In this case, since the upper surfaces of the electronic components 110 are positioned to have the same distance from the lead frame 120, the upper surfaces of the electronic components 110 may be positioned linearly.

Here, the protrusion 122a and the recess 122b formed on the upper surface of the lead frame 120 may be formed to have appropriate sizes according to sizes of the electronic components 110 such that the upper surfaces of the electronic components 110 are positioned to have the same distance from the lead frame 120.

The insulating member 140 may be disposed upwardly of the electronic components 110, and may electrically connect the electronic components 110 to one another.

Since the upper surfaces of the electronic components 110 are positioned to have the same distance from the lead frame 120, the insulating member 140 may be disposed to be parallel to the lead frame 120.

A conductive layer 142 may be formed on one surface of the insulating member 140 and joined to the electronic component 110 through a conductive material, whereby electronic components 110 may be electrically connected to one another.

The conductive member 150 may be disposed between the insulating member 140 and the lead frame 120, and may electrically connect the electronic component 110 to the lead frame 120.

Namely, one side of the conductive member 150 is connected to the lead frame 120, and the other side of the conductive member 150 may be connected to the conductive layer 142 formed on the insulating member 140.

Thus, the electronic component 110 and the lead frame 120 may be electrically connected to one another through the conductive layer 142 formed on the insulating member 140 and the conductive member 150.

In the related art, an electronic component is electrically connected to a lead frame through a bonding wire. In comparison, in the semiconductor package 100 according to an embodiment of the present invention, an electrical connection between the electronic component 110 and the lead frame 120 is implemented through the conductive layer 142 formed on the insulating member 140 and the conductive member 150 without using a bonding wire.

When the electronic component 110 is connected to the lead frame by a bonding wire, heat may be generated due to a soldering process and a wire may be snapped thereby. However, in the semiconductor package 100 according to the embodiment of the present invention, since a bonding wire is not used, the foregoing problem may be prevented.

Namely, in the semiconductor package 100 according to the embodiment of the present invention, the electronic components 110 are electrically connected to one another through the conductive layer 142 formed on the insulating member 140, and the electronic component 110 is electrically connected to the lead frame 120 through the conductive layer 142 and the conductive member 150, and thus, wire deformation and wire snapping do not need to be considered and reliability of electric joining may be enhanced.

Also, since the electronic components 110 are electrically connected to one another through the conductive layer 142, the electronic components 110 may be connected to one another by a significantly reduced distance therebetween.

Also, since a wire is not used, a wire bonding process is not required, simplifying the fabrication process, and since the upper surfaces of the electronic components 110 are adjusted to be positioned to have the same distance from an upper surface of the lead frame 120 through the protrusion 122a and the recess 122b, the semiconductor package 100 may be compact.

The heat dissipation substrate 130 may be disposed downwardly of the lead frame 120 in order to effectively dissipate heat generated from the semiconductor package 100 according to the embodiment of the present invention.

In the semiconductor package 100 according to the embodiment of the present invention, the insulating member 140 is disposed upwardly of the lead frame 120 and the heat dissipation substrate 130 is disposed downwardly of the lead frame 120, and thus, the lead frame 120 may be supported by the heat insulating member 140 and the heat dissipation substrate 130.

Thus, the semiconductor package may be prevented from being distorted or deformed by an external impact, or the like.

The heat dissipation substrate 130 is formed of a metal having excellent heat conductivity in order to enhance heat dissipation characteristics of the semiconductor package 100.

One surface of the heat dissipation substrate 130 may face a lower surface of the lead frame 120, and the other surface of the heat dissipation substrate 130 may be in contact with one surface of a first heat sink 170.

In case of a semiconductor package using a high voltage, a relatively great amount of heat is generated, so an additional heat sink should be attached to the heat dissipation substrate 130.

Like the heat dissipation substrate 130, the first heat sink 170 may be formed of a metal having relatively high heat conductivity, and a surface area of the first heat sink 170 may be greater than that of the heat dissipation substrate 130.

Meanwhile, the semiconductor package 100 according to the embodiment of the present invention may further include a second heat sink 180, and the second heat sink 180 may be attached to an upper surface of the insulating member 140.

Like the first heat sink 170 and the heat dissipation substrate 130, the second heat sink 180 may be formed of a metal having high conductivity, and a surface area of the second heat sink 180 may be greater than that of the insulating member 130.

In this case, since two heat sinks are used, an effective heat dissipation effect may be realized.

The molded portion 160 is filled between the insulating member 140 and the heat dissipation substrate 130 to prevent electrical short circuits between the electronic components 110, and since the molded portion 160 is fixed in the form of surrounding the electronic components 110 from the outside, the molded portion 160 may stably protect the electronic components 110 against external impacts.

The molded portion 160 may be formed to hermetically seal and cover the electronic component 110 and the inner lead 122 of the lead frame 120 to which the electronic component 110 is connected, thus protecting the electronic component 110 against an external environment.

Also, since the molded portion 160 fixes the electronic component 110 by surrounding the electronic component 110 from the outside, it may protect the electronic component 110 against external impacts.

Here, the molded portion 160 may be formed such that the other surface of the heat dissipation substrate 130 is exposed to the outside.

The molded portion 160 may be formed through molding and, in this case, silicon gel, an epoxy mold compound (EMC), polyimide, or the like, having high heat conductivity may be used as a material of the molded portion 160.

However, the present invention is not limited thereto and various methods may be used to form the molded portion 160. Namely, the molded portion 160 may be formed by compressing resin in a semi-hardened state.

Since the first heat sink 170 is formed of a metal having excellent heat conductivity, in the case that the electronic component 110 operates at a relatively high voltage, an electrical short may occur between the outer lead 124 and the first heat sink 170 of the semiconductor package 100 according to the embodiment of the present invention.

Thus, in order to prevent an electrical short between the outer lead 124 and the first heat sink 170, an appropriate isolation distance should be secured therebetween.

Here, the molded portion 160 may cover outer surfaces of the insulating member 140 and the heat dissipation substrate 130 and have sloped surfaces at outer sides of the insulating member 140 and the heat dissipation substrate 130.

With a shape such as that of the molded portion 160, a creepage distance between the outer lead 124 and the first heat sink 170 may be increased.

By increasing the creepage distance, an electrical short circuit between the outer lead 124 and the first heat sink 170 may be prevented.

Figure 6:
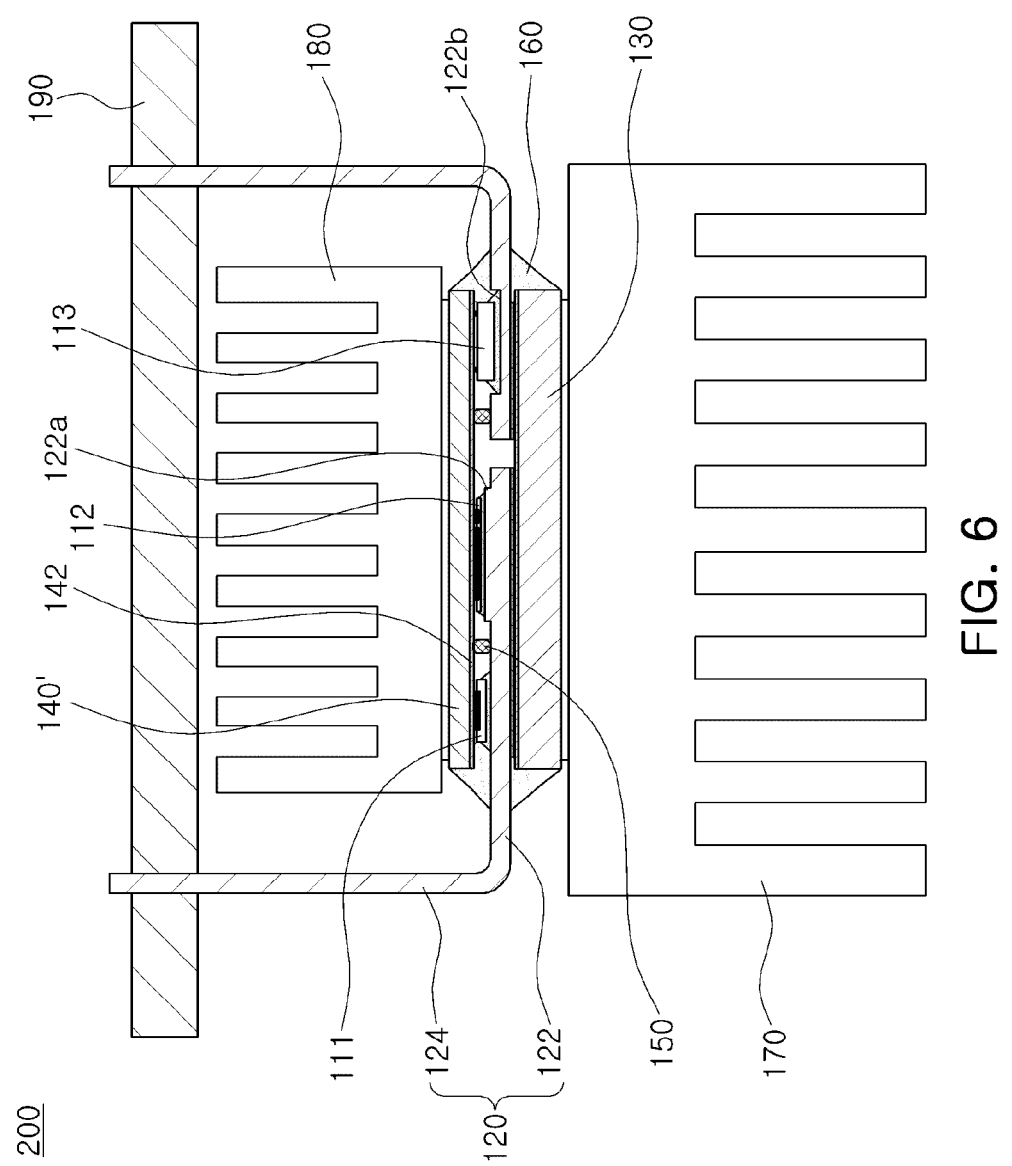
FIG. 6 is a cross-sectional view illustrating a semiconductor package connected to an external substrate according to another embodiment of the present invention.

FIG. 6 is a cross-sectional view illustrating a semiconductor package connected to an external substrate according to another embodiment of the present invention.

Referring to FIG. 6, a semiconductor package 200 according to another embodiment of the present invention is the same as the semiconductor package 100 described above with reference to FIG. 1, except for a heat dissipation member.

The electronic component 110 may be mounted on an upper surface of the lead frame 120. In detail, the electronic component 110 may be mounted on one surface of the inner lead 122.

Here, the upper surface of the lead frame 120 may include the protrusion 122a and the recess 122b, and the electronic components 110 may be disposed in the protrusion 122a and the recess 122b.

The electronic components 110 may have various sizes and shapes according to the type thereof. Thus, a relatively large electronic component 113 may be disposed in the recess 112b, a relatively small electronic component 113 may be disposed on the protrusion 122a, and a medium-size electronic component 111 may be disposed on an upper surface of the lead frame 120 on which the protrusion 122a and the recess 122b are not formed.

Thus, the electronic components 110 may be mounted such that upper surfaces thereof are positioned to have the same distance from an upper surface of the lead frame 120.

Namely, a plurality of electronic components 110 may be mounted on the upper surface of the lead frame 120, and in this case, the electronic components may be appropriately disposed on the inner lead 122 according to sizes thereof, whereby the upper surfaces of the electronic components 110 may be positioned to have the same distance from the lead frame 120.

In this case, since the upper surfaces of the electronic components 110 are positioned to have the same distance from the lead frame 120, the upper surfaces of the electronic components 110 may be positioned linearly.

Here, the protrusion 122a and the recess 122b formed on the upper surface of the lead frame 120 may be formed to have appropriate sizes according to sizes of the electronic components 110 such that the upper surfaces of the electronic components 110 are positioned to have the same distance from the lead frame 120.

A heat dissipation member 140' may be disposed upwardly of the electronic components 110, and may electrically connect the electronic components 110 to one another.

The conductive layer 142 may be formed on one surface of the heat dissipation member 140' and the electronic component 110 may be joined to the conductive layer 142 by using a conductive material, and as a result, the electronic components 110 may be electrically connected to one another through the conductive layer 142.

Since the upper surfaces of the electronic components 110 are positioned to have the same distance from the lead frame 120, the heat dissipation member 140' may be disposed to be parallel to the lead frame 120.

In the semiconductor package 200 according to another embodiment of the present invention, since the heat dissipation member 140' is disposed upwardly of the electronic component 110, a heat dissipation effect may be obtained upwardly of and downwardly of the lead frame 120, improving thermal emission effects.

As set forth above, in the case of the semiconductor package according to embodiments of the invention, electronic components or an electronic component and a lead frame may be electrically connected to one another without using a wire.

Also, electronic components or an electric component and a lead frame may be electrically connected to one another by a significantly reduced distance therebetween.

Also, since a wire is not used, the snapping of wires or the thermal deformation thereof due to a soldering process may be prevented and a fabrication process may be simplified.

Also, the semiconductor package may be reduced in size, material costs may be reduced.

While the present invention has been shown and described in connection with the embodiments, it will be apparent to those skilled in the art that modifications and variations can be made without departing from the spirit and scope of the invention as defined by the appended claims.

What is claimed is:

1. A semiconductor package comprising:
a lead frame having a plurality of electronic component components mounted on one surface thereof;
a heat dissipation substrate disposed downwardly of the lead frame;
an insulating member, including a conductive layer disposed on a surface thereof, the insulating member disposed upwardly of the electronic components to allow the electronic components to be electrically connected to one another;
a conductive member disposed between the insulating member and the lead frame and electrically connecting the electronic components to the lead frame; and
a molded portion hermetically sealing the insulating member and the heat dissipation substrate.

2. The semiconductor package of claim 1, wherein the lead frame has a protrusion formed on one surface thereof, and the electronic components are disposed in the protrusion.

3. The semiconductor package of claim 1, wherein the lead frame has a recess formed in one surface thereof, and the electronic components are disposed in the recess.

4. The semiconductor package of claim 2, wherein the plurality of the electronic components are disposed on one surface of the lead frame, and upper surfaces of the electronic components are positioned linearly.

5. The semiconductor package of claim 3, wherein the plurality of the electronic components are disposed on one surface of the lead frame, and upper surfaces of the electronic components are positioned linearly.

6. The semiconductor package of claim 1, wherein the insulating member and the electronic components are joined by using the conductive layer.

7. The semiconductor package of claim 1, further comprising a first heat sink attached to a lower side of the heat dissipation substrate.

8. The semiconductor package of claim 6, further comprising a second heat sink attached to an upper side of the insulating member.

9. The semiconductor package of claim 1, wherein the molded portion is formed of any one selected from among silicon gel, epoxy molding compound (EMC), and polyimide.

10. A semiconductor package comprising:
- a lead frame having a plurality of electronic components mounted on one surface thereof;
- a heat dissipation substrate disposed downwardly of the lead frame;
- a heat dissipation member electrically joined to the plurality of electronic components and having a conductive layer formed on one surface thereof;
- a conductive member disposed between the heat dissipation member and the lead frame and electrically connecting the electronic components and the lead frame; and
- a molded portion hermetically sealing the heat dissipation member and the heat dissipation substrate,
- upper surfaces of the plurality of electronic components being positioned linearly.

11. The semiconductor package of claim 10, wherein the lead frame includes a protrusion and a recess provided on one surface thereof.

\* \* \* \* \*